United States Patent
Rodi

[19]

[11] Patent Number: 5,563,371
[45] Date of Patent: Oct. 8, 1996

[54] HOUSING FOR AN OPERATION-CONTROLLING ELECTRICAL SYSTEM

[75] Inventor: Anton Rodi, Leimen, Germany

[73] Assignee: Heidelberger Druckmaschinen AG, Heidelberg, Germany

[21] Appl. No.: 309,065

[22] Filed: Sep. 20, 1994

[30] Foreign Application Priority Data

Sep. 20, 1993 [DE] Germany .............. 43 31 864.9

[51] Int. Cl.⁶ .................................. H02G 3/08
[52] U.S. Cl. ........................ 174/52.1; 361/816
[58] Field of Search .............. 174/52.1, 35 GC, 174/35 R; 361/752, 816, 736, 728; 336/90, 84 R

[56] References Cited

U.S. PATENT DOCUMENTS

| | | |
|---|---|---|
| 4,517,564 | 5/1985 | Morishita et al. . |
| 4,531,791 | 7/1985 | Bauchet . |
| 4,587,593 | 5/1986 | Liautaud et al. .................. 361/383 |
| 4,713,634 | 12/1987 | Yamamura ........................ 333/245 |
| 4,751,613 | 6/1988 | Werdin et al. .................... 361/424 |
| 4,760,375 | 7/1988 | Stecker ............................. 340/310 A |
| 4,851,609 | 7/1989 | Reddy ............................... 174/35 R |
| 4,879,630 | 11/1989 | Boucard et al. .................. 361/386 |
| 4,916,575 | 4/1990 | Van Asten ......................... 361/386 |
| 4,972,470 | 11/1990 | Farago . |
| 5,053,926 | 10/1991 | Dickie .............................. 361/424 |
| 5,109,594 | 5/1992 | Sharp et al. . |
| 5,145,417 | 9/1992 | Honkomp et al. ................ 439/685 |
| 5,164,542 | 11/1992 | Hart .................................. 174/35 MS |
| 5,347,430 | 9/1994 | Curlee et al. ..................... 361/816 |
| 5,365,400 | 11/1994 | Ashiwake et al. ................ 361/752 |
| 5,408,383 | 4/1995 | Nagasaka et al. ................ 361/707 |

FOREIGN PATENT DOCUMENTS

| | | |
|---|---|---|
| 0358953 | 3/1990 | European Pat. Off. . |
| 0492061 | 7/1992 | European Pat. Off. . |
| 867764 | 5/1961 | United Kingdom . |
| 874450 | 8/1961 | United Kingdom . |
| 920695 | 3/1963 | United Kingdom . |
| 1230136 | 4/1971 | United Kingdom . |
| 1574356 | 9/1980 | United Kingdom . |
| 1587998 | 4/1981 | United Kingdom . |
| 92/13376 | 8/1992 | WIPO . |
| 93/26062 | 12/1993 | WIPO . |

Primary Examiner—Kristine L. Kincaid
Assistant Examiner—Robert J. Decker
Attorney, Agent, or Firm—Herbert L. Lerner; Laurence A. Greenberg

[57] ABSTRACT

Housing for an electrical system for controlling operations includes a housing wall, at least one connection arrangement provided at the housing wall for connecting a control circuit disposed inside the housing to circuits located outside the housing, and a base forming a unitary body with the housing, the connection arrangement including contact members forming a non-detachable part of the housing wall, the control circuit disposed inside the housing being directly connected to the contact members.

11 Claims, 2 Drawing Sheets

HOUSING FOR AN OPERATION-CONTROLLING ELECTRICAL SYSTEM

BACKGROUND OF THE INVENTION

Field of the Invention

The invention relates to a housing for an operation-controlling electrical system, i.e., for an electrical system for controlling operations on machines and other devices, the housing having a housing wall which is provided with at least one connecting arrangement for connecting a control circuit disposed within the housing to circuits provided outside the housing.

It has become known heretofore to accommodate a control circuit of a machine together with other circuits in a cabinet or housing surrounded by walls. Lines respectively coming out of and going into the machine are led to plug connectors arranged in the housing and cabinet, respectively.

It has also become known heretofore to provide part of the control circuit directly on the machine and a further part in the cabinet and housing, respectively.

In order to protect the parts of a circuit against endangerment from environmental influences, the circuit parts are usually lodged in a cabinet or housing so as to be spatially separated from the machine. In any case, it is necessary to construct the cabinet or housing so that it is suitably sealed in accordance with the requirements.

A disadvantage of the aforementioned constructions is that they require a considerable expenditure for electrical lines, and that a great number of mechanical components must be provided for sealing the cabinet or housing. Furthermore, both the wiring in the machine and the bulk of the circuit elements often impede the operation of the machine. In addition, extensive wiring may cause electromagnetic interference.

It is therefore an object of the invention to provide a housing for an operation-controlling electrical system which is applicable in the vicinity of the machine and improves the reliability of the control circuit of the machine with little effort or expense.

SUMMARY OF THE INVENTION

With the foregoing and other objects in view, there is provided, in accordance with the invention, a housing for an electrical system for controlling operations, comprising a housing wall, at least one connection arrangement provided at the housing wall for connecting a control circuit disposed inside the housing to circuits located outside the housing, and a base forming a unitary body with the housing, the connection arrangement comprising contact members forming a non-detachable part of the housing wall, the control circuit disposed inside the housing being directly connected to the contact members.

In accordance with another feature of the invention, the material of the housing is non-conductive and the contact members are formed so as to contact one another directly for establishing an electrically conductive connection.

In accordance with a further feature of the invention, the contact members are formed so as to establish an optically conductive connection.

In accordance with an added feature of the invention, the contact members are formed as transmitting/receiving elements for wireless transmission of signals.

In accordance with an additional feature of the invention, the transmitting/receiving elements of which the contact members are formed are ultrasonic transmitting/receiving elements.

In accordance with an alternative feature of the invention, the transmitting/receiving elements of which the contact members are formed are electromagnetic transmitting/receiving elements.

In accordance with yet another feature of the invention, the contact members are embedded in the material of which the housing wall is formed, and the housing is hermetically sealed.

In accordance with yet a further feature of the invention, the contact members are formed for selectively establishing a connection with an operating/display unit for a printing press, sensors and actuators arranged in the press, control circuits of sub-aggregates of the press, a power supply unit and a data-transmission device.

In accordance with yet an added feature of the invention, the housing includes fastening elements for fastening the housing to a printing press.

In accordance with yet an additional feature of the invention, the housing includes cooling elements.

In accordance with still another feature of the invention, the housing wall and the base constitute respective walls of the housing, and conductive paths for connecting the respective control circuit to the contact members are applied onto at least one of the respective walls of the housing.

In accordance with still a further feature of the invention, components of the control circuit and connections thereof to one another are integrated in the housing.

In accordance with a concomitant feature of the invention, the housing wall, the base and other walls of the housing are electromagnetically shielded, pass-through filters for the contact members being integrated in the material of which the housing is formed.

Thus, there is provided, in accordance with the invention, a housing having a wall at which at least one connection arrangement connects a control circuit, which is disposed inside the housing, to other circuits, which are located outside the device, the housing together with a base plate forming a unitary body. Moreover, the object of the invention is achieved in that the connection arrangement includes contact members which are non-detachable parts of the housing wall, the control circuit being directly connected to the contact members.

The invention makes it possible to locate the control circuit close to the printing press, requiring only a small number of relatively short lines. By miniaturizing the circuit, all electronic components necessary to control the press, may be lodged in a housing having relatively small dimensions. By directly integrating the contact members into the housing wall, and due to the fact that the housing and the base plate form a unitary body, expense is minimized and a high degree of protection against external influences is assured.

The contact members, which establish electrical contact by contacting one another, are advantageously embedded in the material of the housing wall. In addition to the contact members which effect a direct mutual contact, there may also be provided contact members which permit an optical or otherwise wireless signal transmission, and which are also integrated into the housing wall. So-called contact members which are non-contacting may be in the form of transmitting/receiving elements for sound waves, light waves or electromagnetic waves which effect a wireless signal transmission to the circuits disposed outside the housing and/or to the control circuit arranged inside the housing.

According to a non-illustrated embodiment, the housing together with the contact members may be hermetically sealed, with an opening being provided which is covered by a suitable cap.

The contact members may be selectively connected to an operating/display unit, sensors and actuators, control circuits of further sub-aggregates, and power supply units and a data-transmission device.

Integrating the components of the control circuit and their connections into the material of the housing requires particularly little effort.

Other features which are considered as characteristic for the invention are set forth in the appended claims.

Although the invention is illustrated and described herein as embodied in a housing for an operation-controlling electrical system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

DESCRIPTION OF THE PREFERRED EMBODIMENT

Figure 1:
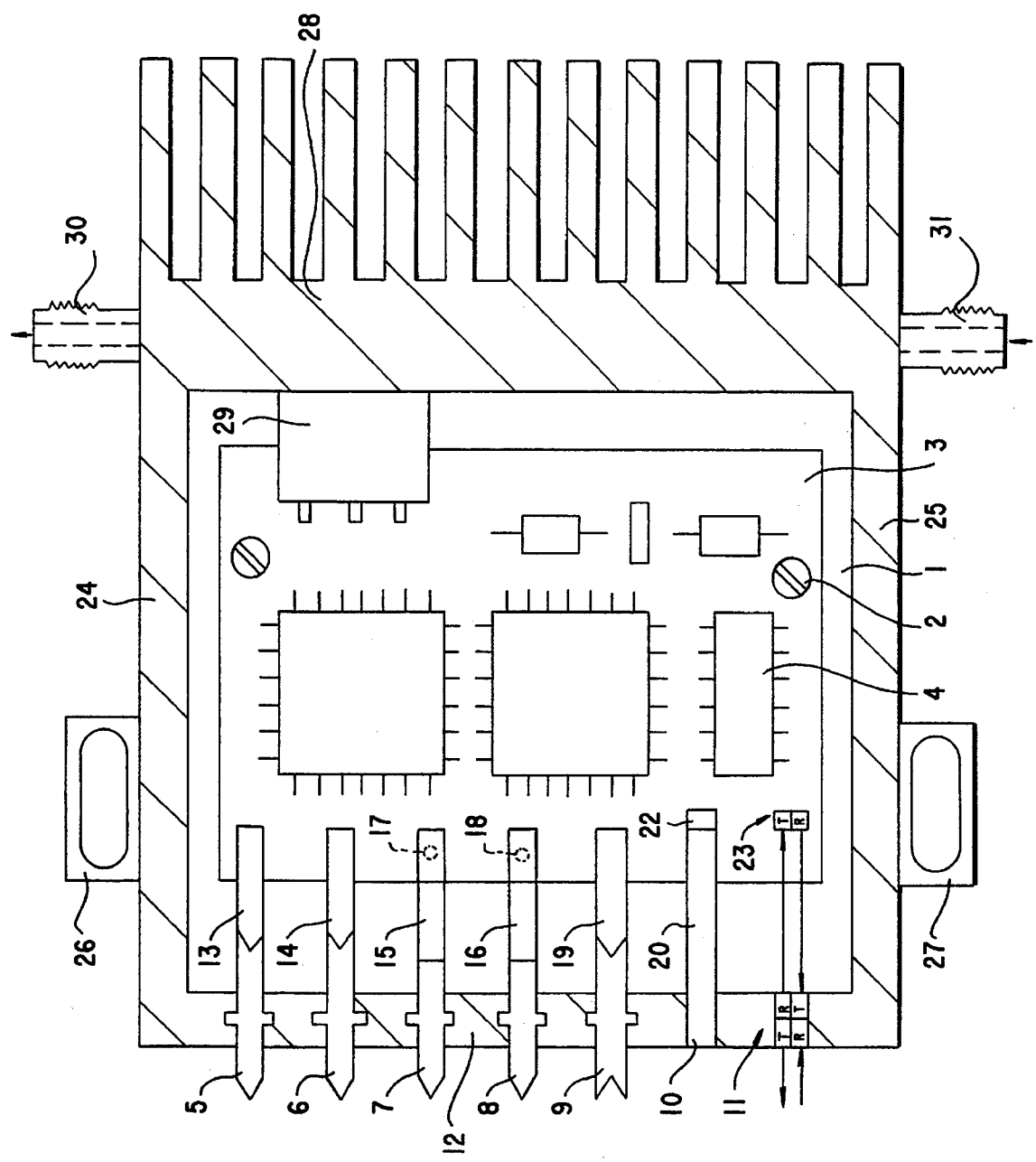
FIG. 1 is a diagrammatic cross-sectional view of a housing for an operation-controlling electrical system according to the invention.

Referring now to the drawings and, first, particularly to FIG. 1 thereof, there is shown therein, in a diagrammatic sectional view, a housing which, together with a base 1, forms a uniform body made of non-conductive material such as, ceramics, plastic materials or glass, for example. Inside the housing, a printed circuit board 3 carrying electric components 4 for a control circuit is fastened by screws 2 to the base 1. The printed circuit board 3 is conductively connected to contact members 5 to 11. The contact members 5 to 11 are embedded closely adjacent to one another in a housing wall 12. As shown in FIG. 1 of the drawing, the contact members 5 to 11 are of various different types of construction. The contact members 5 and 6 are formed as pin contacts on the outside of the housing wall 12 and as socket contacts on the inside of the housing wall 12, pins 13 and 14 of the printed circuit board 3 being connected to the respective socket contacts. Conductor paths 15 and 16, respectively, from the contact members 7 and 8 formed as pin contacts are disposed on the inner surface of the housing wall, the underside of the printed circuit board 3 being connected to the conductor paths 15 and 16 via point contacts 17 and 18, respectively, or press-in contacts. The contact member 9 is formed as a socket contact on both sides thereof, its connection with the printed circuit board 3 being effected by means of a pin 19. The otherwise non-illustrated pass-through filters of the contact members 5 to 9 are also embedded in the housing wall 12. With the aid of light-conducting communication transmission means, in the form of optical fibers, the contact member 10 operates without contact. The signal connection between outside circuits and the control circuit on the inside is established by means of an optical fiber cable 20, opto-electronic transducers 22 being provided for signal launching on the printed circuit board 3.

The contact member 11 is equipped with miniaturized electro-magnetic transmitting elements T and receiving elements R cooperating wirelessly in directions indicated by the arrows with transmitting/receiving-elements 23 provided on the printed circuit board 3 and with transmitting/receiving elements which are located outside the housing and not illustrated in FIG. 1.

On side walls 24 and 25 of the housing, straps 26 and 27, respectively, are provided for fastening the housing to a machine. Another side wall 28 of the housing is formed as a cooling body. A heat-generating circuit element 29 is in thermal contact with the inner side of the side wall 28. The side wall 28 is of hollow construction and may be connected to a cooling system via nipples 30 and 31, if additional cooling is required.

Figure 2:
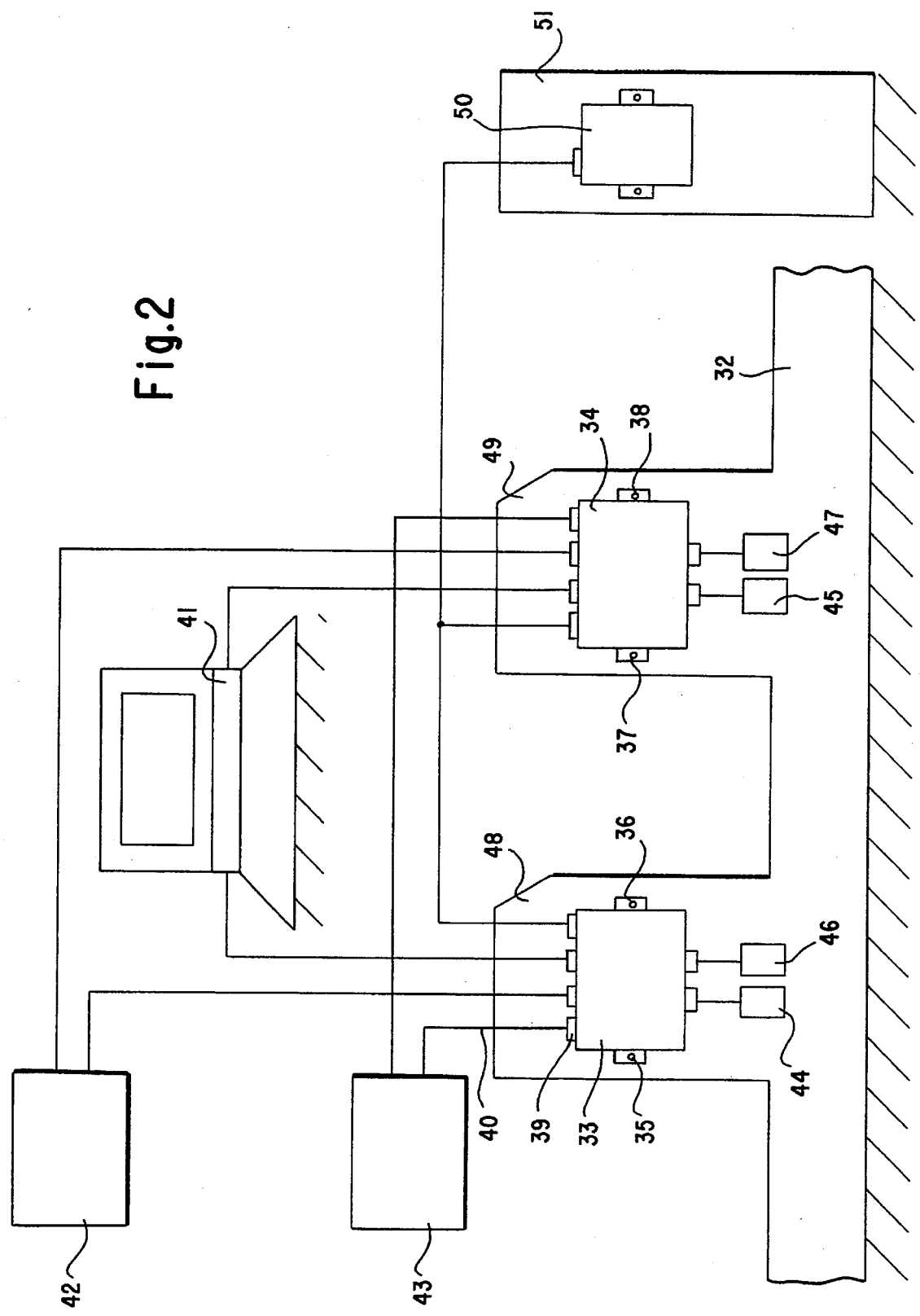
FIG. 2 is a schematic and diagrammatic view of a sheet-fed printing press having an operation-controlling electrical system provided with the housing according to the invention.

FIG. 2 is a schematic and diagrammatic view of several housings such as shown in FIG. 1 as applied on a sheet-fed printing press 32. The housings 33 and 34 are attached to the sheet-fed printing machine 32 by means of straps 35 and 38. Each housing 33, 34 contains a complete control circuit connected via respective connecting elements 39 and respective cables 40 to an operating/display unit 41, a power supply unit 42 and a data-transmission device 43. Further connections are provided in the sheet-fed printing press 32 from the respective control circuits directly to sensors 44 and 45 and adjusting elements 46 and 47, such as electromotors, for example, including a drive/power electronics system.

The housings 33 and 34 containing the control circuits for respective printing units 48 and 49 are connected to other housings 50 containing control circuits for sub-aggregates of the sheet-fed printing press 32, such as a water-purifying or conditioning system 51.

I claim:

1. Housing for an electrical system for controlling operations, comprising a housing wall, at least one connection arrangement provided at said housing wall for connecting a control circuit disposed inside the housing to circuits located outside the housing, and a non-detachable base forming a unitary body with the housing, said connection arrangement comprising contact members forming a non-detachable unitary part of said housing wall, the control circuit disposed inside the housing being directly connected to said contact members.

2. Housing according to claim 1, wherein the material of the housing is non-conductive and said contact members are formed so as to contact one another directly for establishing an electrically conductive connection.

3. Housing according to claim 1, wherein said contact members are formed so as to establish an optically conductive connection.

4. Housing according to claim 1, wherein said contact members are formed as transmitting/receiving elements for wireless transmission of signals.

5. Housing according to claim 4, wherein said transmitting/receiving elements of which said contact members are formed are ultrasonic transmitting/receiving elements.

6. Housing according to claim 4, wherein said transmitting/receiving elements of which said contact members are formed are electromagnetic transmitting/receiving elements.

7. Housing according to claim 1, wherein said contact members are formed for selectively establishing a connection with an operating/display unit for a printing press, sensors and actuators arranged in the press, control circuits of sub-aggregates of the press, a power supply unit and a data-transmission device.

8. Housing according to claim 1, including fastening elements for fastening the housing to a printing press.

9. Housing according to claim 1, including cooling elements.

10. Housing according to claim 1, wherein said housing wall and said base constitute respective walls of the housing, and including conductive paths for connecting the control circuit to said contact members applied onto at least one of the respective walls of the housing.

11. Housing according to claim 1, wherein components of the control circuit and connections thereof to one another are integrated in the housing.

\* \* \* \* \*